(12) United States Patent
Hsu et al.

(10) Patent No.: US 6,690,604 B2
(45) Date of Patent: Feb. 10, 2004

(54) REGISTER FILES AND CACHES WITH DIGITAL SUB-THRESHOLD LEAKAGE CURRENT CALIBRATION

(75) Inventors: Steven K. Hsu, Lake Oswego, OR (US); Shih-Lien L. Lu, Portland, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 10/024,901

(22) Filed: Dec. 18, 2001

(65) Prior Publication Data

US 2003/0112678 A1 Jun. 19, 2003

(51) Int. Cl.[7] ................................................ G11C 7/00
(52) U.S. Cl. ............................... 365/189.05; 365/230.08
(58) Field of Search ............................. 365/189.05, 49, 365/230.08, 203

(56) References Cited

U.S. PATENT DOCUMENTS

| 5,453,708 | A | * | 9/1995 | Gupta et al. ................... 326/98 |
| 5,880,608 | A | * | 3/1999 | Mehta et al. .................. 326/93 |
| 6,600,340 | B2 | * | 7/2003 | Krishnamurthy et al. ...... 326/98 |

* cited by examiner

Primary Examiner—Vu A. Le
(74) Attorney, Agent, or Firm—Seth Z. Kalson

(57) ABSTRACT

A memory circuit, such as a cache or register file, where the keeper functional units are digitally controlled to compensate for variable sub-threshold leakage current.

15 Claims, 4 Drawing Sheets

REGISTER FILES AND CACHES WITH DIGITAL SUB-THRESHOLD LEAKAGE CURRENT CALIBRATION

FIELD

Embodiments of the present invention relate to digital circuits, and more particularly, to memory circuits such as caches or register files.

BACKGROUND

As transistors scale to smaller dimensions, sub-threshold leakage current may present circuit design challenges. In particular, for dynamic (domino) caches and register files, memory cells may contribute to sub-threshold leakage current. If such memory circuits are not designed properly, sub-threshold leakage current may cause a local bit line to be discharged when it shouldn't be, thereby leading to a possible error in a read operation.

For example, FIG. 1 shows a portion of a cache or register file, where for simplicity only one local bit line is shown, and only one memory cell connected to the local bit line is shown. In practice, there usually are a plurality of local bit lines, where each local bit line usually has a plurality of memory cells sharing the local bit line. Memory cell 102 comprises cross-coupled inverters 104, pass-access transistor (nMOSFET) 106, and read-access transistor (nMOSFET) 108. For simplicity, a write port is not shown. Memory cell 102 is connected to local bit line 110.

The clock signal, denoted by $\psi$, is HIGH during an evaluation phase and LOW during a pre-charge phase. Pullup transistor (pMOSFET) 112 is ON during a pre-charge phase to ensure that local bit line 110 is at $V_{cc}$ before the next evaluation phase begins. A read operation occurs during an evaluation phase. During an evaluation phase, pullup transistor 112 is OFF and local bit line 110 is conditionally discharged LOW during a read operation, depending upon the data stored in the memory cell being read. For convenience, without loss of generality, we take the convention that a memory cell stores a logical "1" if it pulls its local bit line LOW during a read operation. Conversely, if a memory cell stores a logical "0", then it does not actively pull its local bit line LOW during a read operation. For example, the gate of pass-access transistor 106 is HIGH ($V_{cc}$) if memory cell 102 stores a logical "1", and the gate is LOW (ground) if a logical "0" is stored.

The combination of inverter 114 and transistor (pMOSFET) 116 form a half-keeper. The half-keeper should be designed to maintain a local bit line in a charged state during an evaluation phase unless it is conditionally discharged during a read operation, where the condition depends upon the stored data. When a memory cell stores a logical "1", there may be sub-threshold leakage current flowing through its read-access transistor. Consider a worst-case scenario in which memory cell 102 stores a logical "0" and each of the other memory cells (not shown) sharing local bit line 110 store a logical "1". Then, during a read operation on memory cell 102, the cumulative effect of the sub-threshold currents in the other memory cells may be sufficient to discharge local bit line 110 so that an incorrect read operation occurs, unless the half-keeper has sufficient strength to maintain local bit line 110 in its charged state.

To compensate for sub-threshold leakage current in the memory cells sharing a local bit line, the half-keeper is often increased in size, e.g., the effective ratio of the gate width to channel length is increased. However, increasing a half-keeper increases contention during a read operation when the stored data being read is a logical "1", thereby possibly increasing the delay in a read operation.

DESCRIPTION OF EMBODIMENTS

Figure 1:
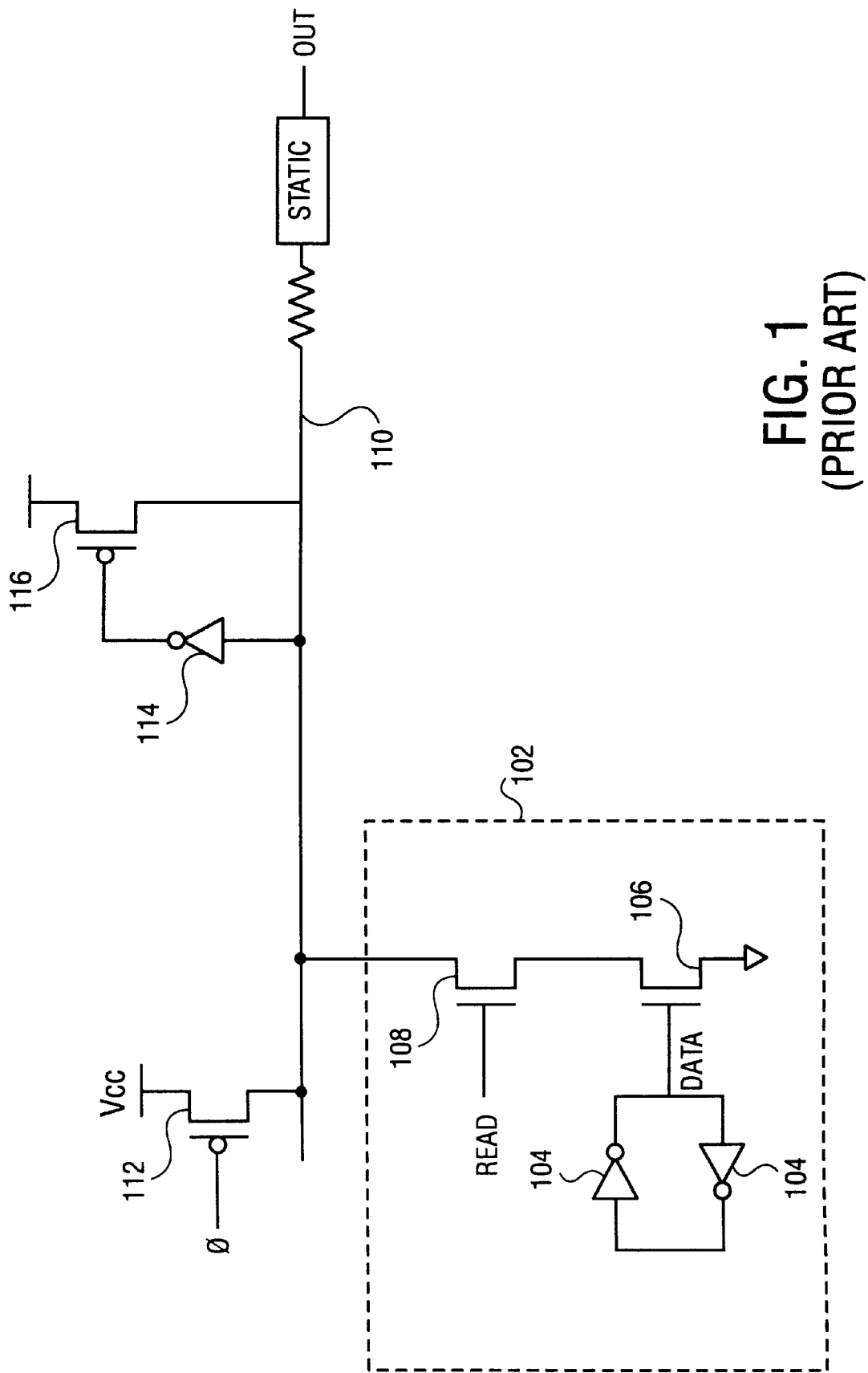
FIG. 1 illustrates a portion of a prior art cache.
Figure 2:
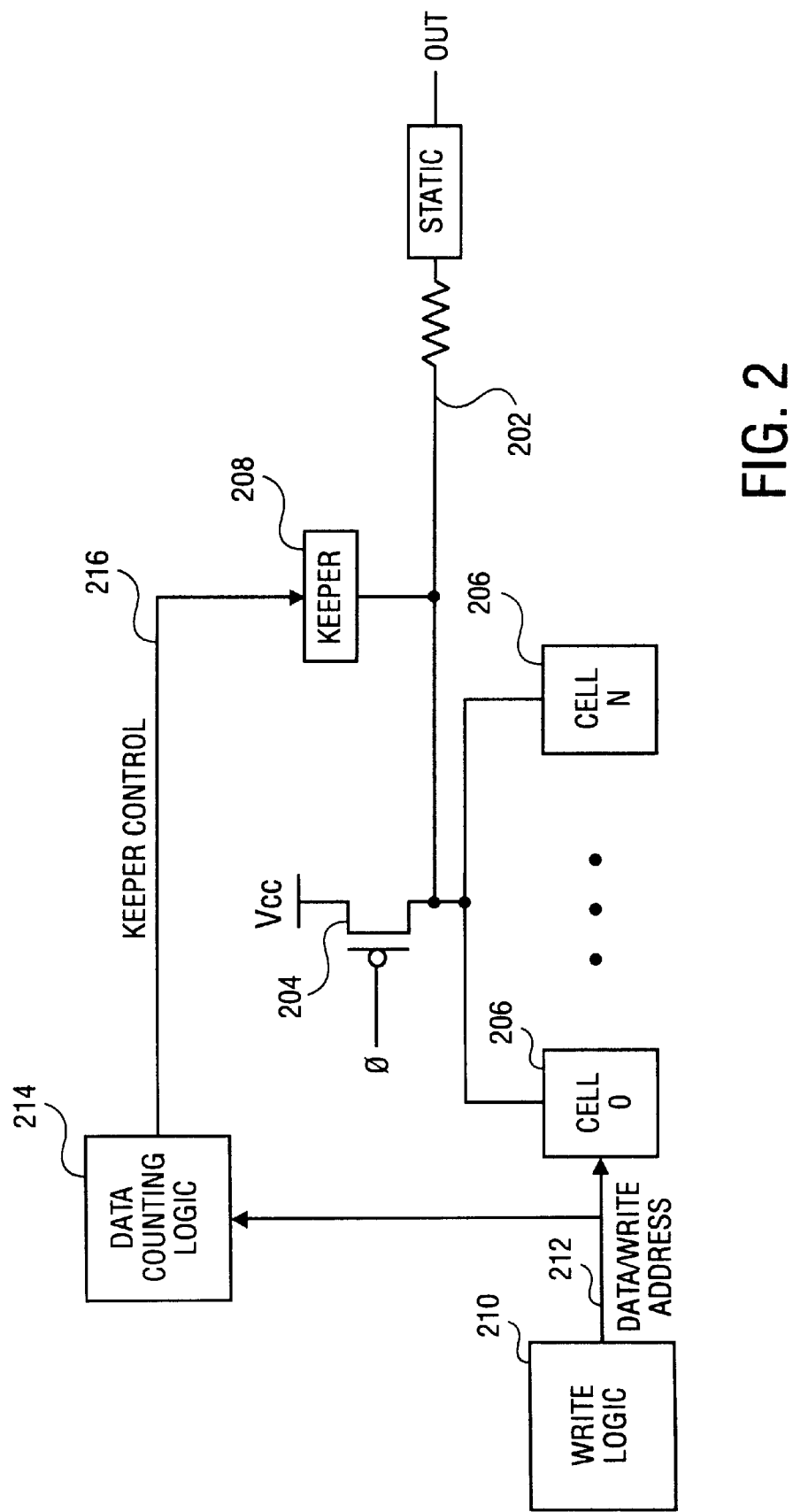
FIG. 2 is an embodiment according to the present invention.

FIG. 2 abstracts an embodiment according to the present invention, which may be employed in register files or caches. For simplicity, only one local bit line is explicitly shown, but in practice a plurality of local bit lines are usually employed. In FIG. 1, N memory cells 206 are connected to local bit line 202, where pullup transistor 204 has the same function has pullup transistor 112 in FIG. 1. For simplicity, the write logic is abstracted by write logic functional unit 210, where ports used for writing data and addressing memory cells are simply abstracted by ports 212.

Keeper 208 maintains local bit line 202 at $V_{cc}$ during an evaluation phase unless local bit line 202 is conditionally pulled LOW by one of memory cells 206 during a read operation. The strength of keeper 208 is variable and depends upon the data stored in memory cells 206. By varying the strength of keeper 208 to depend upon the stored data, maximum keeper strength may be utilized for a worst-case scenario, and less keeper strength may be utilized for other scenarios.

A number of different policies may be employed for varying the strength of keeper 208. For example, the memory cells may be initialized so that each memory cell stores a logical "0", and keeper 208 may be initialized to be at minimum strength. Then, when a memory cell storing a logical "0" is over-written with a logical "1", the strength of keeper 208 is increased, whereas if a memory cell storing a logical "1" is over-written with a logical "0", the strength of keeper 208 is decreased. However, if all memory cells store a logical "1", then keeper 208 need not be at its maximum strength, for any memory cell when read will discharge local bit line 202 LOW, and if no read operation is to be performed on any of memory cells 206, then local bit line 202 is not sensed anyway and will be charged to $V_{cc}$ in the next pre-charge phase.

This policy may be facilitated by data counting logic 214. Data counting logic 214 snoops data and their addresses on data/write-address ports 212. Data counting logic 214 stores a map (table) of addresses and stored data for memory cells 206, and may be implemented in static logic. An address stored in data counting logic 214 may be simply an integer in the range [0, N−1] to indicate a specific memory cell. Based upon this map, it is determined during a write operation whether a memory cell is being re-written, and with what logical data value it is being re-written with, so that keeper 208 may be adjusted accordingly via keeper control signals on keeper control ports 216.

Figure 3:
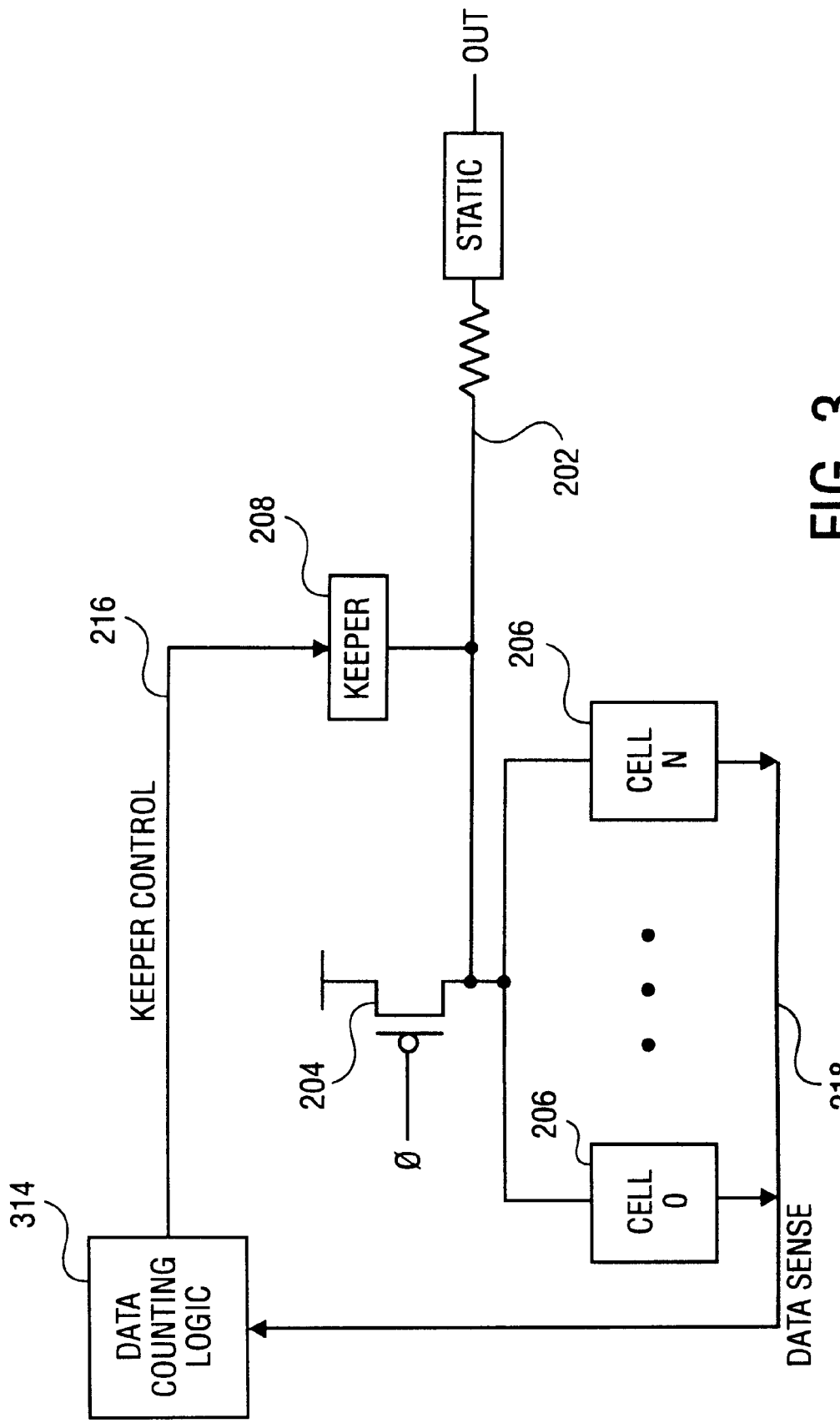
FIG. 3 is another embodiment according to the present invention.

Another embodiment is abstracted in FIG. 3, where a component in FIG. 3 having the same numerical label as a component in FIG. 2 indicates that they have the same or similar function. For simplicity, write logic is not shown. In the embodiment of FIG. 3, data counting logic 314 senses the stored data in memory cells 206 via data sense ports 218. For example, a data sense port of a memory cell may simply be a port connected to an output port of one of the cross-coupled inverters. In this way, data counting logic 214 need not snoop data/write-address ports, and need not store a map of data and addresses. Because data counting logic 314 need not store a map, it is expected that the embodiment of FIG. 3 is easier to implement than that of FIG. 2.

By sensing the stored data in each memory cell, data counting logic 314 may implement keeper control policies similar to or the same as policies implemented in the embodiment of FIG. 2. For example, data counting logic 314 may provide keeper control signals to keeper 208 indicative of the number of memory cells storing a logical "1" (and by implication, the number of memory cells storing a logical "0"), so that the strength of keeper 208 is increased as the number of memory cells storing a logical "1" increases. However, as described earlier, keeper 208 need not have maximum strength for the case in which all memory cells store a logical "1", so that for this case the keeper control signals need not be indicative of the number of memory cells storing a logical The policy described above is not necessarily optimum. For example, based upon this policy, keeper 208 will have maximum strength when only one of memory cells 206 stores a logical "0". However, this is a worst case scenario only when the memory cell storing the logical "0" is to be read. If a memory cell storing a logical "1" is to be read, then keeper 208 need not be adjusted to have maximum strength. However, to implement a revised policy in which this observation is always taken into account, data counting logic 214 or 314 should be able to snoop the read address port and to adjust the strength of keeper 208 as frequently as read operations are performed, at least for the case in which only one of the memory cells stores a logical "0". This may add to design complexity. However, the embodiments described in FIGS. 2 and 3 may implement policies in which the strength of keeper 208 is changed only during a write operation, which happens less frequently than a read operation.

Many policies may be implemented. Even excluding the case in which all memory cells store a logical "1", the strength of keeper 208 need not be a strictly increasing function in the number of memory cells storing a logical "1". For example, data counting logic 314 may sum the number of memory cells storing a logical "1" to obtain an n bit number, but provides keeper control signals that are indicative of only the m most significant bits of the sum, where m<n, so that the keeper strength is an increasing function in the number of memory cells storing a logical "1", but not a strictly increasing function. This policy will be described in more detail below when considering an embodiment of keeper 208.

Many different embodiments for keeper 208 may be implemented. For example, in FIG. 4a, a set of pMOSFET stacks is connected to local bit line 202, each pMOSFET stack sharing inverter 402. Each gate in the set of pMOS-FETs 404 is connected to one port of keeper control ports 216. The keeper control signals comprise a plurality of signals, one signal on each port of keeper control ports 216. The keeper of FIG. 4a is at maximum strength when all the signals on keeper control ports 216 are HIGH, and is at minimum strength when all signals are LOW, with intermediate strengths for other combinations of signals.

Many other embodiments for keeper 208 may be realized. For example, the keeper of FIG. 4a may be modified so that each pMOSFET 406 has its own inverter, and each stack may be re-arranged so that the positions of pMOSFETs 404 are interchanged with the positions of pMOSFETs 406. Another embodiment is shown in FIG. 4b, comprising pMOSFET bleeders 408 and a static half keeper comprising inverter 410 and pMOSFET 412. The embodiment of FIG. 4b may be modified where the static half keeper is removed.

Figure 4A:
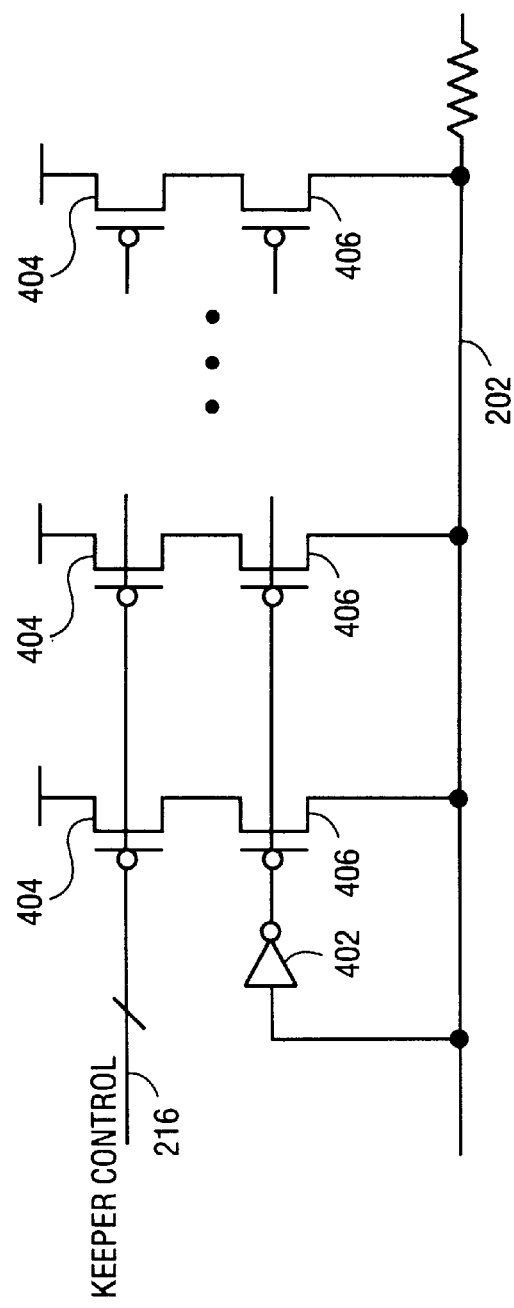
FIGS. 4a and 4b are embodiments of the keeper functional unit in the embodiments of FIGS. 2 and 3.
Figure 4B:
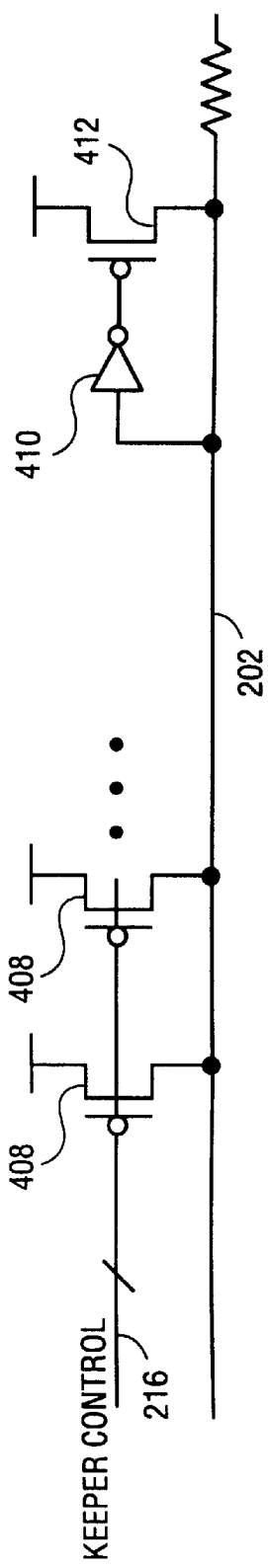

For the particular embodiments of FIGS. 4a and 4b, and their variants, the keeper strength is varied based upon the number of signals on keeper control ports 216 having a HIGH ($V_{cc}$) voltage potential. In an embodiment, for example, the number of memory cells sharing a local bit line may be chosen as $2^n$, and the number of ports (signals) in the keeper control ports (signals) may be chosen as $2^m-1$, where $m \leq n$. An exemplary embodiment of a keeper control policy is for data counting logic 314 in FIG. 3 to sum the number of memory cells 206 storing a logical "1" so as to provide an n bit summed result, and to decode the m most significant bits of the summed result to provide the keeper control signals. The decoding is such that, except for the case in which all memory cells store a logical "1", the number of keeper control signals having a HIGH voltage is equal to the one plus the numerical value of the m most significant bits when considered an m bit number. (This way, at least one signal is held HIGH even if all memory cells store a logical "0".) However, for the case in which all memory cells store a logical "1", all signals are held LOW.

Many embodiments of the present invention may be realized without departing from the scope of the invention as claimed below. Clearly, a large number of embodiments for keeper 208 may be realized, as discussed previously. To facilitate in reading the claims, it is to be understood that a memory cell stores a logical "1" if its state is such that when read, its local bit line is nominally discharged LOW.

What is claimed is:

1. A memory device comprising:
   a set of memory cells;
   a local bit line coupled to the set of memory cells; and
   a keeper having variable strength coupled to the local bit line, where the keeper strength is a function of data stored in the set of memory cells.

2. The memory device as set forth in claim 1, further comprising:
   a data counting logic to vary the strength of the keeper as a function of the data stored in the set of memory cells.

3. The memory device as set forth in claim 2, wherein the keeper strength is an increasing friction in the number of memory cells in the set of memory cells storing a logical "1".

4. The memory device as set forth in claim 3, wherein the increasing function is a strictly increasing function.

5. The memory device as set forth in claim 1, wherein the keeper strength is an increasing function in the number of memory cells in the set of memory cells storing a logical "1".

6. The memory device as set forth in claim 5, wherein the increasing function is a strictly increasing function.

7. A memory device having an evaluation phase and a pre-charge phase, the device comprising:
   a set of memory cells;
   a local bit line connected to the set of memory cells to provide a voltage indicative of a state of one memory cell in the set of memory cells during a read operation performed on the one memory cell; and
   a keeper to maintain the local bit line in a charged state during a pre-charge phase and during an evaluation phase when no read operation is performed on the set of memory cells, and during an evaluation phase if not conditionally discharged by the one memory cell during a read operation; the keeper comprising a set of keeper control ports, each keeper control port having a keeper control voltage, so that the keeper has a variable strength controlled by the keeper control voltages.

8. The memory device as set forth in claim 7, further comprising:

a data counting logic to provide the keeper control voltages.

9. The memory device as set forth in claim 8, wherein the data counting logic provides the keeper control voltages such that the keeper strength is an increasing function in the number of memory cells in the set of memory cells storing a logical "1".

10. The memory device as set forth in claim 9, wherein the increasing function is a strictly increasing function.

11. A memory device comprising:

a set of memory cells;

a local bit line connected to the set of memory cells;

a keeper connected to the local bit line, the keeper comprising a set of keeper control ports each having a keeper control voltage; and a data counting logic to provide the keeper control voltages to control the strength of the keeper.

12. The memory device as set forth in claim 11, further comprising:

a set of data sense ports to provide signals to the data counting logic indicative of the states of the set of memory cells.

13. The memory device as set forth in claim 12, wherein the data counting logic provides the keeper control voltages so that the keeper strength is an increasing function in the number of memory cells in the set of memory cells storing a logical "1'.

14. The memory device as set forth in claim 13, wherein the increasing function is a strictly increasing function.

15. The memory device as set forth in claim 12, further comprising:

a set of data ports to provide signals indicative of data to be stored in the set of memory cells;

a set of write-address ports to provide signals indicative of a write address;

wherein the set of data ports and write-address ports are connected to the data counting logic so that the keeper strength is an increasing function in the number of memory cells in the set of memory cells storing a logical "1".

* * * * *